(12) United States Patent
Han et al.

(10) Patent No.: US 12,009,419 B2
(45) Date of Patent: Jun. 11, 2024

(54) SUPERJUNCTION SEMICONDUCTOR DEVICE AND METHOD OF MANUFACTURING SAME

(71) Applicant: DB HiTek Co., Ltd., Bucheon-si (KR)

(72) Inventors: Yong Sin Han, Jeonju-si (KR); Myeong Bum Pyun, Incheon (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 213 days.

(21) Appl. No.: 17/569,284

(22) Filed: Jan. 5, 2022

(65) Prior Publication Data

US 2022/0271154 A1 Aug. 25, 2022

(30) Foreign Application Priority Data

Feb. 25, 2021 (KR) .................. 10-2021-0025371

(51) Int. Cl.
*H01L 29/78* (2006.01)
*H01L 29/06* (2006.01)
*H01L 29/40* (2006.01)
*H01L 29/423* (2006.01)
*H01L 29/66* (2006.01)
*H01L 29/739* (2006.01)

(52) U.S. Cl.
CPC ...... *H01L 29/7802* (2013.01); *H01L 29/0623* (2013.01); *H01L 29/0634* (2013.01); *H01L 29/402* (2013.01); *H01L 29/42376* (2013.01); *H01L 29/66333* (2013.01); *H01L 29/66712* (2013.01); *H01L 29/7395* (2013.01); *H01L 29/7811* (2013.01); *H01L 29/42368* (2013.01)

(58) Field of Classification Search
CPC ............. H01L 29/0634; H01L 29/7802; H01L 29/66712; H01L 29/66333; H01L 29/7395; H01L 29/42368; H01L 29/0623
See application file for complete search history.

(56) References Cited

U.S. PATENT DOCUMENTS

| | | | | |
|---|---|---|---|---|
| 5,631,177 A | * | 5/1997 | Zambrano | H01L 29/7802 257/E21.624 |
| 6,025,646 A | * | 2/2000 | Sakai | H01L 21/76802 257/341 |
| 6,559,011 B1 | * | 5/2003 | Shibib | H01L 29/7835 257/329 |
| 6,768,171 B2 | * | 7/2004 | Disney | H01L 21/823493 257/E29.256 |
| 7,301,203 B2 | | 11/2007 | Lee et al. | |

(Continued)

FOREIGN PATENT DOCUMENTS

KR 10-2005-0052597 A 6/2005

*Primary Examiner* — Britt D Hanley
*Assistant Examiner* — Victor V Barzykin
(74) *Attorney, Agent, or Firm* — Andrew D. Fortney; Central California IP Group, P.C.

(57) ABSTRACT

Disclosed are a superjunction semiconductor device and a method of manufacturing the same. More particularly, the present disclosure relates to a superjunction semiconductor device and a method of manufacturing the same, in which the device includes a field oxide layer having an uppermost end or surface that is higher than that of a gate oxide layer, between a gate electrode and a second pillar region in a cell region. This enables a reduction in gate-drain parasitic capacitance, thereby increasing switching speed and reducing switching loss.

8 Claims, 6 Drawing Sheets

(56) References Cited

U.S. PATENT DOCUMENTS

| | | | |
|---|---|---|---|
| 7,576,393 B2* | 8/2009 | Ono | H01L 29/7802 257/493 |
| 7,655,981 B2 | 2/2010 | Lee et al. | |
| 8,569,150 B2* | 10/2013 | Willmeroth | H01L 29/0634 438/269 |
| 8,928,077 B2* | 1/2015 | Lee | H01L 29/0634 257/341 |
| 9,853,099 B1* | 12/2017 | Huang | H01L 29/66681 |
| 2005/0116313 A1 | 6/2005 | Lee et al. | |
| 2007/0128810 A1* | 6/2007 | Kao | H01L 29/42368 257/E29.268 |
| 2008/0211053 A1 | 9/2008 | Lee et al. | |
| 2008/0246085 A1* | 10/2008 | Saito | H01L 29/7802 257/E29.066 |
| 2009/0236680 A1* | 9/2009 | Willmeroth | H01L 29/7802 257/E21.336 |
| 2010/0308399 A1* | 12/2010 | Saito | H01L 29/7811 257/329 |
| 2011/0049616 A1* | 3/2011 | Saggio | H01L 29/7811 257/E27.06 |
| 2011/0169081 A1* | 7/2011 | Ishikawa | H01L 21/02532 257/341 |
| 2011/0189839 A1* | 8/2011 | Willmeroth | H01L 29/0878 257/E21.09 |
| 2014/0179079 A1* | 6/2014 | Huang | H01L 29/0619 438/286 |
| 2015/0162430 A1* | 6/2015 | Zinn | H01L 29/4916 257/329 |
| 2015/0162431 A1* | 6/2015 | Zinn | H01L 29/42368 257/329 |
| 2015/0380541 A1* | 12/2015 | Arai | H01L 21/02529 257/77 |
| 2017/0054009 A1* | 2/2017 | Lee | H01L 29/66333 |
| 2020/0127088 A1* | 4/2020 | Lee | H01L 29/0696 |
| 2022/0005924 A1* | 1/2022 | Lee | H01L 21/02532 |
| 2022/0367616 A1* | 11/2022 | Dai | H01L 29/66734 |

* cited by examiner

SUPERJUNCTION SEMICONDUCTOR DEVICE AND METHOD OF MANUFACTURING SAME

CROSS REFERENCE TO RELATED APPLICATION

The present application claims priority to Korean Patent Application No. 10-2021-0025371, filed Feb. 25, 2021, the entire contents of which are incorporated herein for all purposes by this reference.

BACKGROUND OF THE INVENTION

Field of the Invention

The present disclosure relates to a superjunction semiconductor device and a method of manufacturing the same. More particularly, the present disclosure relates to a superjunction semiconductor device and a method of manufacturing the same, in which the device includes a field oxide layer having an uppermost end or surface that is higher than that of a gate oxide layer, between a gate electrode and a second pillar region in a cell region. This enables a reduction in the gate-drain parasitic capacitance, thereby increasing switching speed and reducing switching loss.

Description of the Related Art

In general, a high-voltage semiconductor device, such as a power metal-oxide-semiconductor field-effect transistor (MOSFET) and an insulated gate bipolar transistor (IGBT), includes a source region and a drain region that are on an upper surface and a lower surface of a drift region, respectively. In addition, the high-voltage semiconductor device includes a gate insulating layer on the upper surface of the drift region adjacent to the source region, and a gate electrode on the gate insulating layer. In a turn-on state of the high-voltage semiconductor device, the drift region provides a conductive path through which a drift current flows from the drain region to the source region. In a turn-off state of the high-voltage semiconductor device, the drift region provides a depletion region that expands vertically in response to an applied reverse bias voltage.

The characteristics of the depletion region provided by the drift region determine the breakdown voltage of the high-voltage semiconductor device. In the above-described high-voltage semiconductor device, to minimize conduction loss in the turn-on state and to ensure fast switching speed, research has been conducted on reducing the resistance of the drift region serving as a conductive path in the turn-on state. It is generally known in the art that the turn-on resistance of the drift region can be reduced by increasing the concentration of dopant impurities in the drift region. However, when the concentration of impurities in the drift region increases, space charges increase in the drift region, thereby reducing the breakdown voltage of the device.

As a solution to this drawback, high-voltage semiconductor devices having a superjunction structure have been proposed to ensure a high breakdown voltage, while reducing resistance in a turn-on state.

Figure 1:
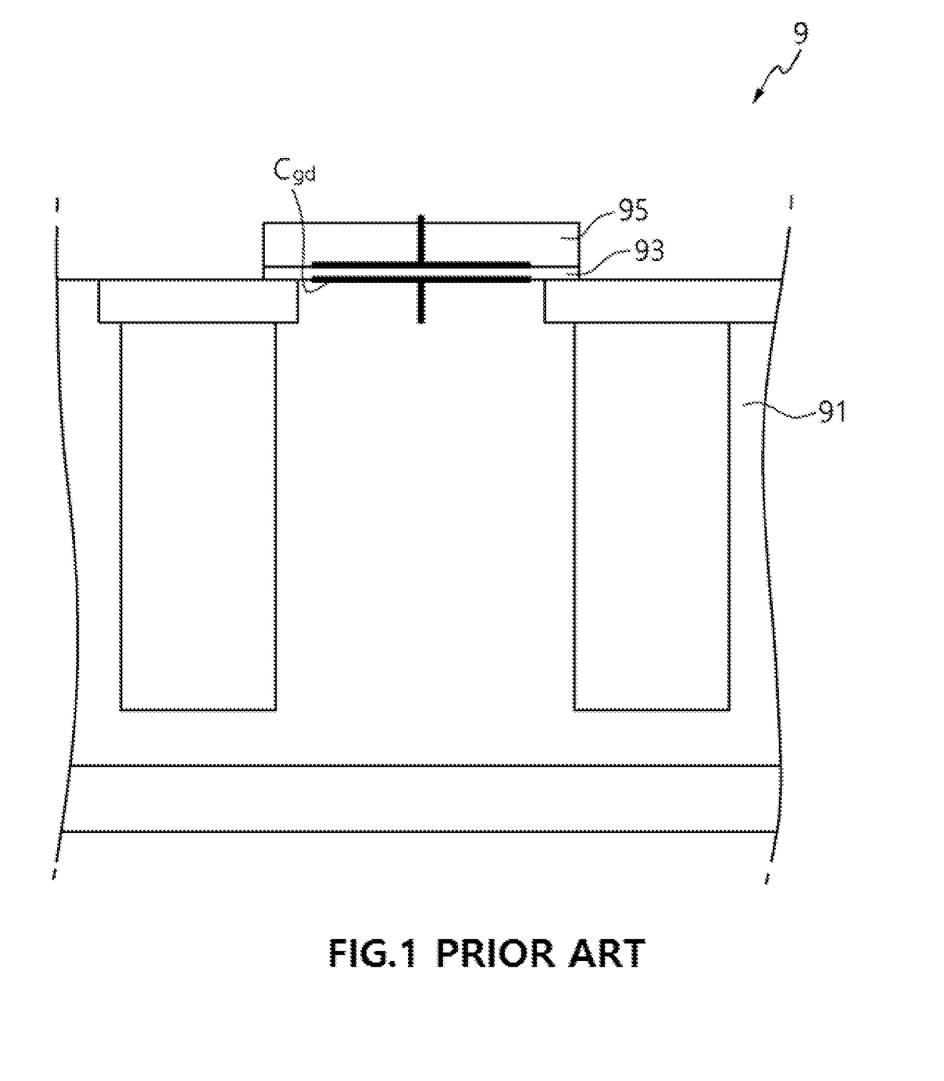
FIG. 1 is a cross-sectional view illustrating a superjunction semiconductor device according to the related art.

FIG. 1 is a cross-sectional view illustrating a superjunction semiconductor device 9 according to the related art.

Referring to FIG. 1, the superjunction semiconductor device 9 includes a gate oxide layer 93 of substantially uniform thickness formed on an epitaxial layer 91, and a gate electrode 95 formed on the gate oxide layer 93. The gate electrode 95 has a lower surface in full contact with the gate oxide layer 93.

During the on/off process of the semiconductor device 9, the gate-drain parasitic capacitance (Cgd) between overlapping regions of the gate electrode 95 and the drain region has a dominant influence on switching speed. The parasitic capacitance (Cgd) is affected by the thickness of the gate oxide layer 93 and the area or size of the overlapping regions of the gate electrode 95 and the drain region. Therefore, in the structure of the semiconductor device 9 illustrated in FIG. 1, since the lower surface of the gate electrode 95 is in full contact with the gate oxide layer 93, the value of the parasitic capacitance (Cgd) increases, thus inevitably resulting in an unnecessarily low switching speed.

To solve the above problems, the inventors of the present disclosure have created a novel superjunction semiconductor device having an improved structure so as to reduce the gate-drain parasitic capacitance (Cgd), and a method of manufacturing the same.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2005-0052597 "Superjunction semiconductor device"

SUMMARY OF THE INVENTION

Accordingly, the present disclosure has been made keeping in mind the above problems occurring in the related art, and an objective of the present disclosure is to provide a superjunction semiconductor device and a method of manufacturing the same, in which the device includes a gate insulating layer having a portion thicker than a gate oxide layer between a gate electrode and an epitaxial layer in a cell region, so that the gate electrode is substantially split. This enables a reduction in gate-drain parasitic capacitance, and thus, an increase in the switching speed.

Another objective of the present disclosure is to provide a superjunction semiconductor device and a method of manufacturing the same, in which the gate insulating layer is formed at the same time as a field oxide layer in the process of forming the field oxide layer, so that an additional process is not required to form the gate insulating layer, thereby increasing production efficiency.

In order to achieve the above objectives, the present disclosure may be implemented by embodiments having one or more of the following configurations.

According to one or more embodiments of the present disclosure, there is provided a superjunction semiconductor device including: a substrate having a cell region and a ring region; a plurality of first pillars horizontally spaced in a second pillar in the cell region and the ring region; a first body region in an upper portion of the second pillar in the cell region; a source region in the first body region; a gate oxide layer on the second pillar in the cell region; a gate insulating layer on the second pillar in the cell region; and a gate electrode on the gate insulating layer and the gate oxide layer in the cell region.

According to another embodiment of the present disclosure, the gate insulating layer may have an uppermost end or surface that is higher than an uppermost end or surface of the gate oxide layer.

According to another embodiment of the present disclosure, the gate insulating layer may have inclined surfaces extending obliquely upward by a predetermined length, and sloped upward from lateral ends of the gate insulating layer or portions adjacent to the lateral ends to an uppermost end or surface of the gate insulating layer.

According to another embodiment of the present disclosure, the superjunction semiconductor device may further include a field oxide layer in the ring region. The gate insulating layer may be formed with the field oxide layer in the same process.

According to another embodiment of the present disclosure, the gate electrode may have a lower surface that has a shape complementary to a shape of an upper surface of the gate insulating layer.

According to another embodiment of the present disclosure, there is provided a superjunction semiconductor device including: a substrate having a cell region and a ring region; a plurality of first conductivity type first pillars horizontally spaced in a second conductivity type second pillar in the cell region and the ring region; a first conductivity type first body region in an upper portion of the second pillar in the cell region; a second conductivity type source region in the first body region; a gate oxide layer having a substantially uniform thickness on the second pillar in the cell region; a gate insulating layer on the second pillar in the cell region; and a gate electrode on the gate insulating layer and the gate oxide layer in the cell region. The gate insulating layer may have an uppermost end or surface that is higher than an uppermost end or surface of the gate oxide layer.

According to another embodiment of the present disclosure, the substrate may further include an edge region, and the superjunction semiconductor device may further include a first conductivity type second body region in the upper portion of the second pillar in the edge region.

According to another embodiment of the present disclosure, the gate insulating layer may be in contact with the gate oxide layer at ends thereof.

According to another embodiment of the present disclosure, the gate insulating layer may have at least one inclined surface extending obliquely upward.

According to another embodiment of the present disclosure, the gate electrode may have a center portion on the gate insulating layer and opposite ends or sides on the gate oxide layer.

According to another embodiment of the present disclosure, there is provided a method of manufacturing a superjunction semiconductor device, the method including forming a second conductivity type epitaxial layer on a substrate; forming a plurality of first conductivity type pillars in the epitaxial layer, spaced apart from each other in a horizontal direction; forming a field oxide layer in the epitaxial layer in a ring region; forming a gate insulating layer on the epitaxial layer in a cell region; forming a gate oxide layer in the cell region, in contact with the gate insulating layer; and forming a gate electrode on the gate insulating layer and the gate oxide layer. Each of the field oxide layer and the gate insulating layer may have an uppermost end or surface that is higher than an uppermost end or surface of the gate oxide layer.

According to another embodiment of the present disclosure, the field oxide layer and the gate insulating layer may be formed substantially simultaneously.

According to another embodiment of the present disclosure, the field oxide layer and the gate insulating layer may be formed by forming a first insulating layer on the epitaxial layer in the cell region and the ring region, and then etching the first insulating layer using a first mask pattern.

According to another embodiment of the present disclosure, the gate insulating layer may be formed by forming a second insulating layer on the epitaxial layer and then etching the second insulating layer using a second mask pattern.

According to another embodiment of the present disclosure, the gate electrode may be formed by forming a gate layer on the field oxide layer, the gate insulating layer, and the second insulating layer, and then sequentially etching the gate layer and the second insulating layer using a second mask pattern.

According to another embodiment of the present disclosure, the gate electrode may have inclined portions extending obliquely upward by a predetermined length, and sloped upward from lateral ends or sides of the gate electrode or portions adjacent to the lateral ends or sides to an uppermost end or surface of the gate electrode.

According to another embodiment of the present disclosure, the method may further include forming a first body region by implanting first conductivity type impurities in the cell region using the gate electrode as a mask pattern; and forming a source region by implanting second conductivity type impurities in the first body region.

According to another embodiment of the present disclosure, there is provided a method of manufacturing a superjunction semiconductor device, the method including forming a second conductivity type epitaxial layer on a substrate; forming a plurality of first conductivity type pillars in the epitaxial layer; forming a first insulating layer on the epitaxial layer, and then forming a field oxide layer in a cell region and a gate insulating layer in a ring region by etching the first insulating layer using a first mask pattern; forming a second insulating layer on the epitaxial layer after forming the field oxide layer and the gate insulating layer; forming a gate layer on the field oxide layer, the gate insulating layer, and the second insulating layer; and forming a gate oxide layer and a gate electrode by sequentially etching the gate layer and the second insulating layer using a second mask pattern. The gate insulating layer may have at least one inclined surface extending obliquely upward.

The present disclosure has the following effects.

The gate insulating layer having a portion thicker than the gate oxide layer is provided between the gate electrode and the epitaxial layer in the cell region so that the gate electrode is substantially split. This enables a reduction in gate-drain parasitic capacitance, and thus, an increase in the switching speed.

Also, the gate insulating layer is formed at the same time as the field oxide layer so that an additional process is not required, thereby increasing production efficiency.

Meanwhile, the effects of the present disclosure are not limited to the effects described above, and other effects not stated can be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. Embodiments of the present disclosure can be modified in various Rams. Therefore, the scope of the disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

It will be understood that when an element (or layer) is referred to as being on another element (or layer), it can be directly on the other element, or one or more intervening elements (or layers) may be therebetween. In contrast, when an element is referred to as being directly on or above another component, no intervening elements are therebetween. Note that the terms "on", "above", "below", "upper", "lower", etc. are intended to describe one element's relationship to one or more other elements as illustrated in the figures.

While the terms "first", "second", "third", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or performed in an order opposite to the described order.

The term "metal-oxide-semiconductor (MOS)" used herein is a general term. "M" is not limited to only metal and may include various types of conductors. "S" may be a substrate or a semiconductor structure. "O" is not limited to only oxide and may include various types of organic and inorganic materials.

In addition, the conductivity type or doped region of the elements may be defined as "P-type" or "N-type" according to the main carrier characteristics. However, this is only for convenience of description, and the technical spirit of the present disclosure is not limited to the above-mentioned examples. For example, instead of "P-type" or "N-type," the more general terms "first conductivity type" and "second conductivity type" will be used hereinafter, where the first conductivity type may refer to P-type, and the second conductivity type may refer to N-type.

It should be further understood that the terms "heavily doped" and "lightly doped" representing the doping concentration of impurity regions mean the relative doping concentrations of elements.

Figure 2:
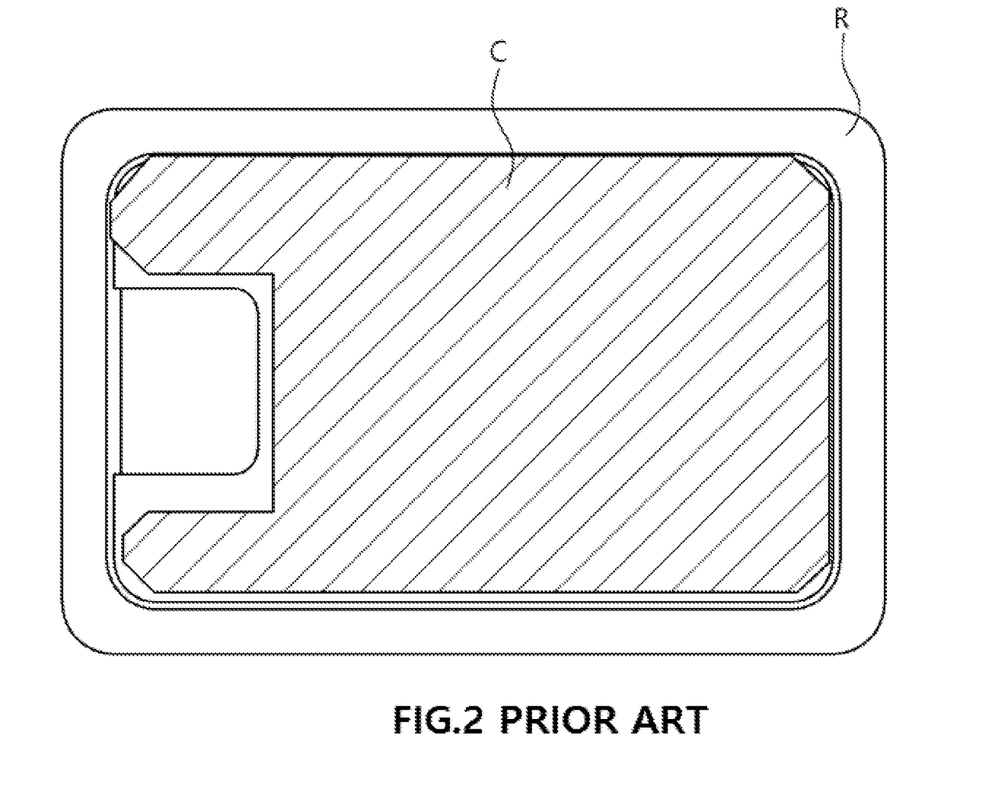
FIG. 2 is a plan view illustrating a typical superjunction semiconductor device.
Figure 3:
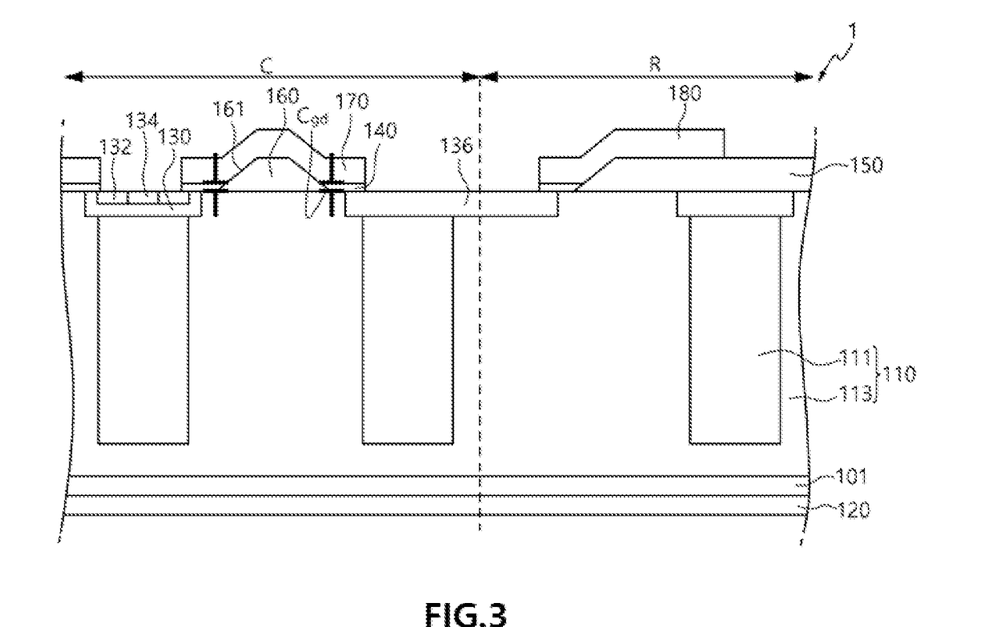
FIG. 3 is a cross-sectional view illustrating an exemplary superjunction semiconductor device according to an embodiment of the present disclosure.

FIG. 2 is a plan view illustrating a typical superjunction semiconductor device, and FIG. 3 is a cross-sectional view illustrating an exemplary superjunction semiconductor device 1 according to an embodiment of the present disclosure.

Hereinafter, the superjunction semiconductor device 1 will be described in detail with reference to the accompanying drawings.

The superjunction semiconductor device 1 is characterized in that a field oxide layer having an uppermost end or surface that is higher than a gate oxide layer is between a gate electrode and a second pillar region in a cell region of the device. This enables a reduction in the gate-drain parasitic capacitance (Cgd), thereby increasing switching speed and reducing switching loss.

Referring to FIG. 2, the superjunction semiconductor device 1 includes the cell region C serving as an active region; and a ring region R that surrounds the cell region C and may serve as a termination region.

Referring to FIG. 3, a substrate 101 may comprise a silicon substrate or a germanium substrate, and may include a bulk wafer or an epitaxial layer. The substrate 101 may be, for example, a heavily doped second conductivity type substrate.

A pillar region 110 is formed on the substrate 101. The pillar region 110 includes a plurality of first conductivity type (e.g., first) pillars 111 and a second conductivity type (e.g., second) pillar 113 that may alternate in a horizontal direction. Alternatively, the first pillars 111 may be in the second pillar 113, and the second pillar 113 may surround and underlie each of the first pillars 111. The first pillars 111 may extend substantially in a vertical direction from the substrate 101, and the second pillar 113 may be directly on and/or in contact with the substrate 101, with substantially planar contact surfaces therebetween. The first pillars 111 may have a stripe shape extending in the vertical direction. Alternatively, the contact surfaces may be curved in opposite or complementary directions. However, the scope of the present disclosure is not limited to specific examples. The second pillar 113 comprises a lightly doped impurity region and may be formed by, for example, epitaxial growth. In addition, the plurality of first pillars 111 may be spaced apart from each other across the cell region C and the ring region R in the horizontal direction. The pillar region 110 may be in both the cell region C and the ring region R. Unlike as illustrated in the drawings, the first pillars 111 in the ring region R may have upper ends that are connected to each other.

A drain electrode 120 may be formed on the underside of the substrate 101, on a surface opposite from the gate electrode 170. A first body region 130 having a first conductivity type and a predetermined depth extends in a predetermined direction in an upper portion or exposed surface of a first pillar 111 and/or the second pillar 113. For example, the first body region 130 may have a lower portion that is connected to or in contact with an upper end of an associated first pillar 111. The first body region 130 is formed in the cell region C at a position other than an edge region (a peripheral portion of the cell region C that is at the boundary with the ring region R), and may or may not be formed in the ring region R, but is not limited thereto.

A second conductivity type source region 132 is formed in the first body region 130. The source region 132 may comprise a heavily doped region. At least one source region 132 may be formed in the first body region 130. For example, two source regions 132 may be formed. Therefore, current paths may be respectively formed at opposite sides of each of the first pillars 111, facing the second pillar 113. A first conductivity type body contact region 134 may be formed in the first body region 130 at a position adjacent to and/or in contact with the source region 132. The body contact region 134 comprises a heavily doped impurity region and has a depth such that the body contact region 134 is in contact with the first body region 130.

When the voltage according to an avalanche current of the device approaches the built-in electrical potential of the junction of the source region 132 and the first body region 130, a parasitic bipolar junction transistor (BJT) is turned on such that an error, which is referred to as an unclamped inductive switching (UIS) error, occurs in the device. The heavily doped body contact region 134 may remove this UIS error. The source region 132 and the body contact region 134 are not formed in the edge region and the ring region R, but are preferably formed only in the cell region C.

A second body region 136 having the first conductivity type and a predetermined depth may be formed on the second pillar 113 in the edge region, connected to and/or in contact with an upper end of an associated first pillar 111. The second body region 136 extends in a predetermined direction. The second body region 136 may have substantially the same doping concentration as the first body region 130, and thus, may be formed at the same time and in the same process as the first body region 130. The second body region 136 may comprise a doped region having a doping concentration higher than that of the first pillars 111.

The gate oxide layer 140 is formed on the second pillar 113 in the cell region C, and serves as an insulating layer. The gate electrode 170 (which will be described later) may overlap the gate oxide layer 140. The gate oxide layer 140 may comprise a silicon oxide layer, a high-k dielectric layer, or a combination thereof. The gate oxide layer 140 may be formed by atomic layer deposition (ALD), chemical vapor deposition (CVD), or physical vapor deposition (PVD). The field oxide layer 150 is formed on the second pillar 113 in the ring region R. The field oxide layer 150 may comprise a silicon oxide layer, a high-k dielectric layer, or a combination thereof. The field oxide layer 150 may be formed by ALD, CVD, or PVD.

The field oxide layer 150 has an uppermost end or surface that is higher than the uppermost end or surface of the gate oxide layer 140. That is, the field oxide layer 150 is thicker than the gate oxide layer 140, except for lateral end portions thereof. A gate insulating layer 160 may be formed on the second pillar 113 in the cell region C. The gate insulating layer 160 may comprise the same material(s) as the field oxide layer 150 and may be at the same time as the field oxide layer 150 in the same process, but is not limited thereto. The gate insulating layer 160 has an uppermost end or surface that is higher than the uppermost end or surface of the gate oxide layer 140.

For example, the gate insulating layer 160 may have at least one inclined surface 161 extending obliquely upward. In detail, the gate insulating layer 160 may have inclined surfaces 161 at opposite sides thereof. The inclined surfaces 161 are sloped upward from the lateral ends to the uppermost surface of the gate insulating layer 160. The pair of inclined surfaces 161 may have the same or different inclination angles and lengths.

The gate insulating layer 160 may have a substantially triangular shape or trapezoidal shape in cross-section, but is not limited thereto. An advantage achieved by the gate insulating layer 160 having a portion that is higher or thicker than the gate oxide layer 140 as described above will be described in detail. Referring to FIG. 1, in the structure of a superjunction semiconductor device 9 according to the related art, a gate oxide layer 93 of substantially uniform thickness is formed on an epitaxial layer 91, and a gate electrode 95 is formed on the gate oxide layer 93. When the semiconductor device 9 switches (e.g., from on to off, or from off to on), a gate-drain parasitic capacitance (Cgd), which occurs between overlapping regions of the gate electrode 95 and a drain region, has a dominant influence on the switching speed. The parasitic capacitance (Cgd) is affected by the thickness of the gate oxide layer 93 and the unit area or size of the overlapping regions of the gate electrode 95 and the drain region.

To reduce the parasitic capacitance (Cgd), the semiconductor device 1 according to the present disclosure includes a gate insulating layer 160 having a portion thicker than the gate oxide layer 140, between the gate electrode 170 and the second pillar 113 in the cell region C. Therefore, the gate electrode 170 is substantially split by the gate insulating layer 160. In addition, as will be described later, because the gate insulating layer 160 is formed at the same time as and/or in the same process as the field oxide layer 150, an additional process is not required.

Figure 10:
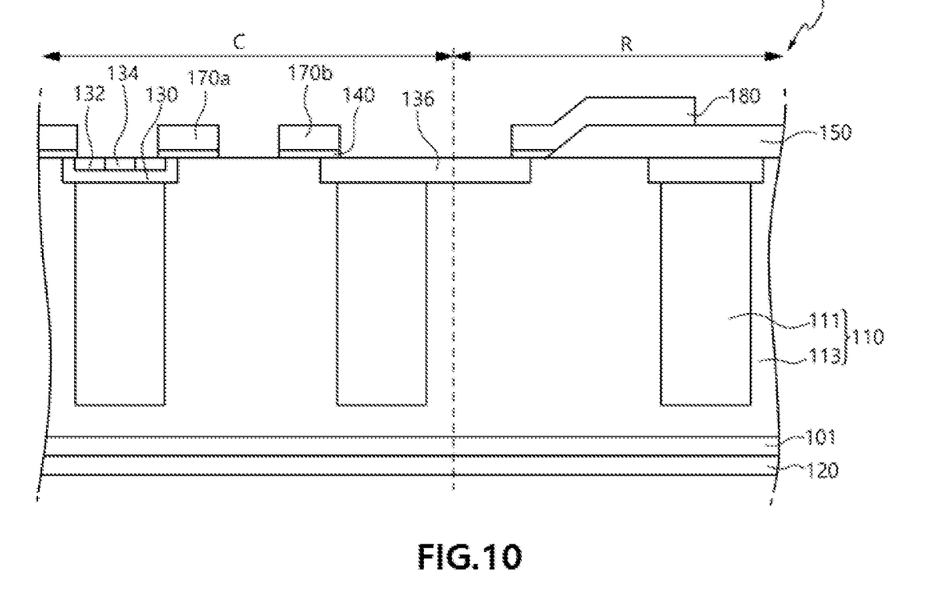
FIG. 10 is a reference cross-sectional view illustrating an exemplary gate electrode comprising two portions.

To achieve the effect desired in the present disclosure, for example, a center portion of the gate electrode 170 may be removed or etched to form two gate portions (e.g., left and right portions) 170a and 170b (see, e.g., FIG. 10). However, this approach requires an additional process of forming a mask pattern and then etching to remove the center portion of the gate electrode 170, so production efficiency is inevitably lowered.

Referring to FIG. 3, in the case of the device 1, the gate electrode 170 is formed on the gate insulating layer 160 in the cell region C. For example, the gate electrode 170 may have a lower surface that has a shape complementary to the shape of an upper surface of the gate insulating layer 160, and opposite ends or sides thereof that are on the gate oxide layer 140 and have a substantially planar shape. A channel region may be turned on or off in response to a gate voltage applied to the gate electrode 170. The gate electrode 170 may comprise conductive polysilicon, metal, a conductive metal nitride, or a combination thereof, and may be formed by CVD, PVD, ALD, metalorganic ALD (MOALD), or metalorganic CVD (MOCVD).

In the ring region R, the floating electrode 180 may be formed on the field oxide layer 150, spaced apart from the gate electrode 170. The floating electrode 180 may serve as a termination region, or a field stop layer (e.g., for stopping an electric field).

FIGS. 4 to 9 are reference cross-sectional views illustrating an exemplary method of manufacturing a superjunction semiconductor device according to one or more embodiments of the present disclosure.

Hereinafter, a method of manufacturing a superjunction semiconductor device according to embodiment(s) of the present disclosure will be described in detail with reference to the accompanying drawings. It should be noted that the steps of forming each configuration may be performed in an order different than that presented, or may be performed substantially simultaneously.

Figure 4:
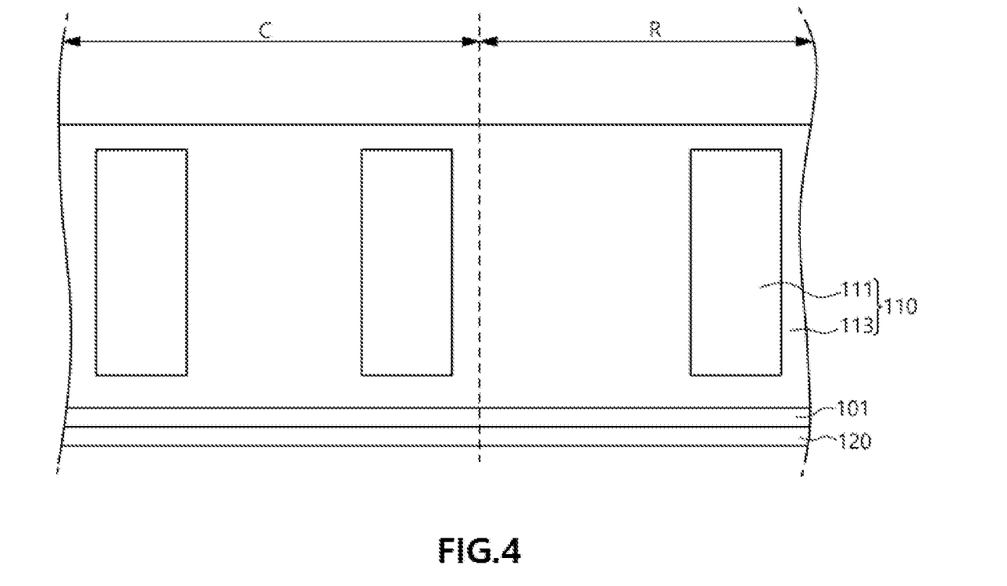
FIGS. 4 to 9 are reference cross-sectional views illustrating an exemplary method of manufacturing a superjunction semiconductor device according to an embodiment of the present disclosure.

First, referring to FIG. 4, a second conductivity type second pillar 113 serving as an epitaxial layer and a plurality of first pillars 111 in the second pillar 113 are formed on a substrate 110. The second pillar 113 may be formed by, for example, epitaxial growth. After that, one or more deep trenches extending into the epitaxial layer 113 from an upper surface thereof may be formed. A plurality of deep trenches may be spaced apart from each other, and may be formed, for example, by etching using a mask pattern (not illustrated). Thereafter, the mask pattern is removed.

Subsequently, a semiconductor material containing first conductivity type impurities is deposited onto the epitaxial layer 113 and in the trenches. A CMP process is then performed to remove the semiconductor material from above the uppermost surface of the epitaxial layer 113 so that the uppermost surface of the epitaxial layer 113 is exposed, and the semiconductor material remains in the trenches. The first pillars 111 may be formed by repeating the deposition and CMP processes. The reason for repeating the processes a plurality of times is that, the trenches have a large aspect ratio, it may be difficult to fill the individual trenches by a single deposition process without generating voids therein.

Alternatively, the first and second pillars 111 and 113 may be formed by forming a plurality of second conductivity type epitaxial layers, forming a first conductivity type implant layer in a predetermined region of each of the epitaxial layers, and diffusing the first conductivity type impurities by heat treatment. Typically, a single epitaxial layer is deposited, the first conductivity type impurities are implanted therein (e.g., by ion implantation), and the deposition/implantation sequence is repeated until the second pillar 113 has a predetermined (or the target) thickness. The diffusion treatment can be conducted after each deposition/implantation cycle, or after all of the deposition/implantation steps have been performed. The diffusion treatment may also activate the first conductivity type impurities implanted into the epitaxial layers. In the above manner, the first pillars 111 and the second pillar 113 may be formed in a cell region C and a ring region R However, the manner of forming the first pillars 111 and the second pillar 113 are only exemplary, and the present disclosure is not limited thereto.

Figure 5:
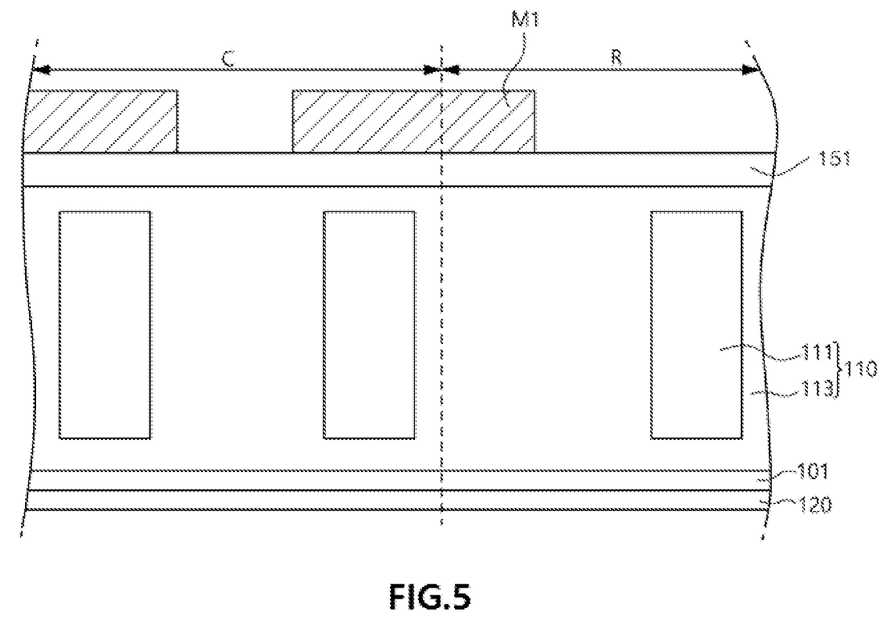

Referring to FIG. 5, a field oxide layer 150 and a gate insulating layer 160 are formed. For example, a first insulating layer 151 (e.g., having a uniform thickness) may be formed on the second pillar 113 in the cell region C and the ring region R, after which the first insulating layer 151 may be etched using the first mask pattern M1, except for the region where the field oxide layer 150 and the gate insulating layer 160 are to remain. For example, the first insulating layer 151 may be etched by a process that forms a sloped or angled sidewall on the field oxide layer 150 and the gate insulating layer 160 (e.g., using a carbon-containing thy etchant).

Figure 6:
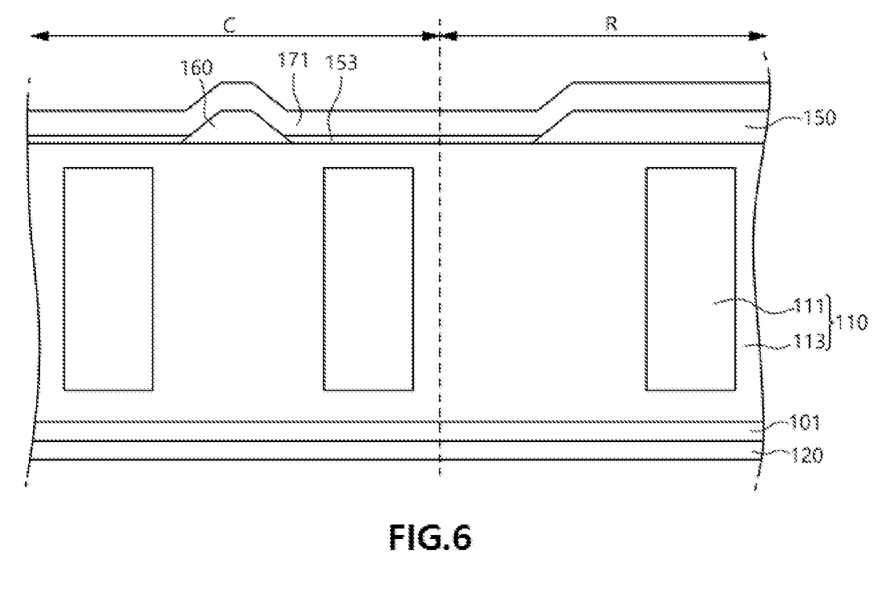

Referring to FIG. 6, a second insulating layer 153 for forming a gate oxide layer 140 is formed on the epitaxial layer 113. The second insulating layer 153 may be deposited on exposed surface(s) of the second pillar 113 (e.g., where the field oxide layer 150 and the gate insulating layer 160 are not formed) using a patterned mask (not illustrated) to block deposition of the silicon dioxide (or precursor thereof) on the field oxide layer 150 and the gate insulating layer 160. Alternatively, the second insulating layer 153 may be deposited so as to partially overlap ends of the field oxide layer 150 and the gate insulating layer 160, or may be grown by thermal or chemical oxidation of the exposed surface of the second pillar 113. In a further alternative, the field oxide layer 150 and the gate insulating layer 160 are partially deposited (e.g., to a thickness less than the predetermined or target thickness for the field oxide layer 150 and the gate insulating layer 160), and the second insulating layer 153 is blanket-deposited onto the exposed surface(s) of the second pillar 113, the field oxide layer 150 and the gate insulating layer 160 so that each of the second insulating layer 153, the field oxide layer 150 and the gate insulating layer 160 reach their predetermined or target thicknesses. Thereafter, a gate layer 171 (e.g., comprising a conductive polysilicon layer) is formed on the field oxide layer 150, the gate insulating layer 160, and the second insulating layer 153.

Figure 7:
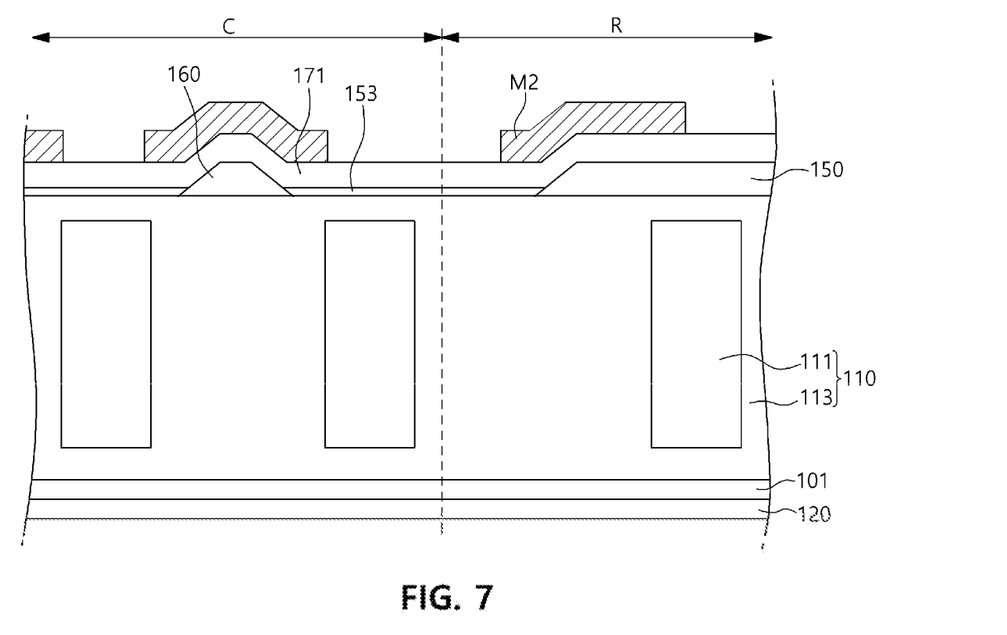

Referring to FIG. 7, after forming a second mask pattern M2 on the gate layer 171, the gate layer 171 and the second insulating layer 153 are sequentially etched with the second mask pattern M2 in place. As a result, a gate electrode 170, a floating electrode 180, and the gate oxide layer 140 are formed. The gate electrode 170 may have a stripe shape and may be between adjacent first pillars 111 in the cell region C.

Figure 8:
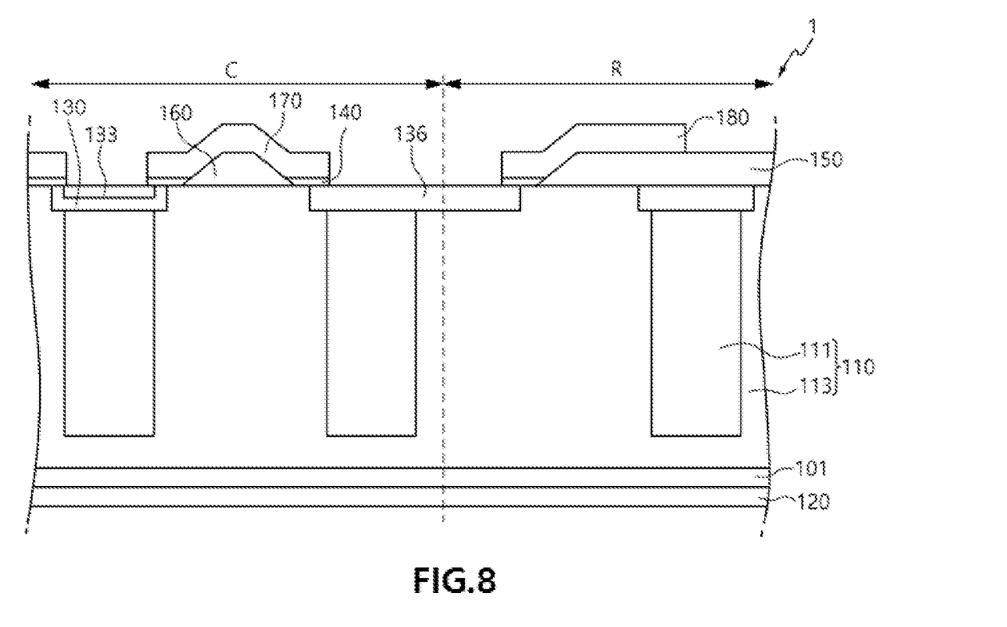

Referring to FIG. 8, a first body region 130 and a second body region 136 are formed. For example, the first body region 130 and the second body region 136 may be formed by implanting first conductive type impurities in an upper portion of the second pillar 113 using the gate electrode 170 and the floating electrode 180 as a mask. Thereafter, a second conductivity type impurity region 133 for forming a source region 132 may be formed by implanting a heavy dose of second conductivity type impurities in the first body region 130 (e.g., after forming a patterned mask blocking implantation of the second conductivity type impurities in the second body region 136).

Figure 9:
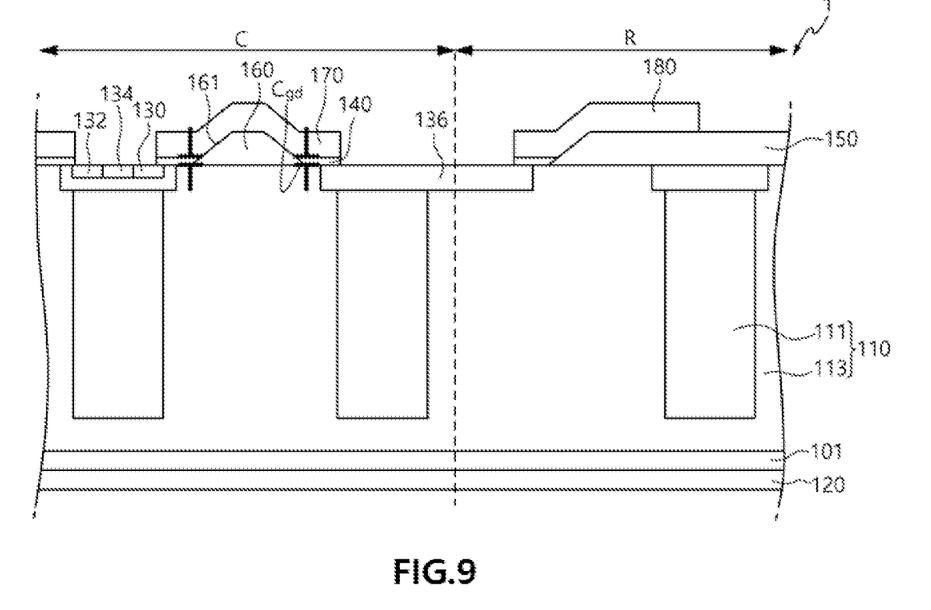

Finally, referring to FIG. 9, a body contact region 134 is formed in the second conductivity type impurity region 133. The regions of the second conductivity type impurity region 133 in which the body contact region 134 is not formed are the source region(s) 132. The body contact region 134 may be formed by implanting first conductivity type impurities in the body region 130 using a mask pattern (not illustrated) to block implantation in regions of the device in which the body contact region 134 is not formed, but is not limited thereto.

As described above, the method of manufacturing the superjunction semiconductor device according to the present disclosure is advantageous in that a gate-drain parasitic capacitance (Cgd) is reduced, thereby increasing switching speed.

Referring to FIG. 10, to reduce the gate-drain parasitic capacitance (Cgd), a center portion of the gate electrode 170 may be etched to form left and right side gate electrode portions 170a and 170b. However, this approach disadvantageously requires an additional process of forming a third mask pattern M3 and then etching to remove the center portion of the gate electrode 170. Therefore, the method of manufacturing the superjunction semiconductor device according to the present disclosure is also advantageous in increasing production efficiency.

The foregoing detailed descriptions may be merely an example of the prevent disclosure. Also, the inventive concept is explained by describing the preferred embodiments and will be used through various combinations, modifications, and environments. That is, the inventive concept may be amended or modified without departing from the scope of the technical idea and/or knowledge in the art. The foregoing embodiments are for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiments.

What is claimed is:

1. A method of manufacturing a superjunction semiconductor device, the method comprising:
   forming a second conductivity type epitaxial layer on a substrate;
   forming a plurality of first conductivity type pillars in the epitaxial layer;
   forming a first insulating layer on the epitaxial layer, and then forming a field oxide layer in a ring region and a gate insulating layer in a cell region by etching the first insulating layer using a first mask pattern;
   forming a second insulating layer on the epitaxial layer after forming the field oxide layer and the gate insulating layer;
   forming a gate layer on the field oxide layer, the gate insulating layer, and the second insulating layer; and
   forming a gate oxide layer and a gate electrode by sequentially etching the gate layer and the second insulating layer using a second mask pattern,
   wherein the gate insulating layer has at least one inclined surface extending obliquely upward.

2. A method of manufacturing a superjunction semiconductor device, the method comprising:
   forming a second conductivity type epitaxial layer on a substrate;
   forming a plurality of first conductivity type pillars in the epitaxial layer;
   forming a first insulating layer on the epitaxial layer, and then forming a field oxide layer in a ring region and a gate insulating layer in a cell region by etching the first insulating layer using a first mask pattern;
   forming a second insulating layer on the epitaxial layer after forming the field oxide layer and the gate insulating layer;
   forming a gate layer on the field oxide layer, the gate insulating layer, and the second insulating layer; and
   forming a gate oxide layer and a gate electrode by sequentially etching the gate layer and the second insulating layer using a second mask pattern, wherein:
   the gate insulating layer has at least one inclined surface extending obliquely upward, and
   the gate insulating layer has an uppermost end or surface that is higher than an uppermost end or surface of the gate oxide layer.

3. The method of claim 2, further comprising:
   forming a first body region by implanting first conductivity type impurities in the cell region using the gate electrode as a mask pattern; and
   forming a source region by implanting second conductivity type impurities in the first body region.

4. The method of claim 2, wherein the gate electrode has a lower surface that has a shape complementary to a shape of an upper surface of the gate insulating layer.

5. The method of claim 2, wherein the gate insulating layer is in contact with the gate oxide layer at ends thereof.

6. The method of claim 2, wherein the gate electrode has a center portion on the gate insulating layer and opposite ends or sides on the gate oxide layer.

7. The method of claim 2, wherein the first conductivity type pillars are spaced apart from each other in a horizontal direction.

8. The method of claim 2, wherein each of the field oxide layer and the gate insulating layer has an uppermost end or surface that is higher than an uppermost end or surface of the gate oxide layer.

* * * * *